United States Patent [19]

Kudo

[11] 4,178,877

[45] Dec. 18, 1979

[54] APPARATUS FOR PLASMA TREATMENT OF SEMICONDUCTOR MATERIALS

[75] Inventor: Daiziro Kudo, Yokohama, Japan

[73] Assignee: Fujitsu Limited, Japan

[21] Appl. No.: 885,996

[22] Filed: Mar. 13, 1978

[30] Foreign Application Priority Data

Mar. 11, 1977 [JP] Japan ................................ 52-26862

[51] Int. Cl.² ...................... H01L 21/306; C03F 00/00
[52] U.S. Cl. .................................. 118/728; 204/164;
204/192 EC; 204/298; 250/531; 250/423 R;
427/38; 156/643; 156/646
[58] Field of Search ............................. 250/527–531;
427/39, 38, 47; 204/164, 192 EC, 192 E, 298;
156/643, 646, 345; 118/49.1, 49.5, 50.1, 620,
623, 625

[56] References Cited

U.S. PATENT DOCUMENTS

| | | | |
|---|---|---|---|
| 3,450,617 | 6/1969 | Hellund | 250/53 X |
| 3,875,068 | 4/1975 | Mitzel | 250/542 X |
| 3,971,684 | 7/1976 | Muto | 204/192 E |
| 3,984,301 | 10/1976 | Matsuzaki et al. | 204/192 E |

Primary Examiner—William A. Powell
Attorney, Agent, or Firm—Staas & Halsey

[57] ABSTRACT

An improved arrangement of electrode plates, semiconductor materials, electrode supports, and electrical power supplying circuitry is useful for plasma treatment of semiconductor materials in a reaction tube in the presence of a reaction gas.

19 Claims, 25 Drawing Figures

P=0.6 (Torr)
E=5 (W/wafer)

*Fig. 19*   P=0.6 (Torr)
D=17 (mm)

APPARATUS FOR PLASMA TREATMENT OF SEMICONDUCTOR MATERIALS

BACKGROUND OF THE INVENTION

1. Field of the Invention

The present invention relates to a method and an apparatus used for plasma treatment of substrate materials such as semiconductor substrates or wafers. The plasma treatment includes chemical vapor deposition by means of plasma, for example, the deposition of insulating substances or semiconductor substances on the surfaces of the semiconductor materials, and plasma etching, for example, the etching of semiconductor materials or of the coatings formed on the semiconductor materials.

2. Description of the Prior Art

A proposal was made in U.S. Pat. No. 3,837,856, in which a first chamber containing semiconductor wafers is located at a predetermined distance from a second chamber which produces a plasma discharge, this second chamber being communicated with the first chamber through the connection path at an end of the second chamber. Reaction substances in an plasma produced by the electrodeless radio frequency excitation in the second chamber are transmitted to the first chamber through the connection path. Semiconductor materials are treated by such reaction substances in the first chamber. However, according to this U.S. Patent, a uniform distribution of the plasma treatment cannot be realized either with regard to the surface of a semiconductor wafer or with regard to a series of semiconductor wafers, the speed of the plasma treatment cannot be increased because of a decrease in the effectiveness of the reaction substances and because of a loss of the reaction substances due to their being deposited on the walls of the first and the second chambers, and the speed of mass-producing the treated semiconductor materials in relatively low because of the limited number of semiconductor wafers which are treated simultaneously in the first chamber. Besides, if this U.S. Patent is used for carrying out chemical vapor deposition of semiconductor materials, undesirable vapor decomposition tends to take place, and the impurities produced by such decomposition are included in the deposit, which forms the coating on the semiconductor material, so that the quality of the coating becomes poor.

Another plasma treatment was proposed in U.S. Pat. No. 3,615,956, in which semiconductor wafers are placed into a number of parallel slots extending longitudinally in a boat arranged in the reaction tube. A pair of elongated semicircular plates is provided on the outer surface of the reaction tube. The surfaces of the semiconductor wafers are all arranged in parallel with the axis of the reaction tube. However, according to this U.S. Patent, the effects of the plasma treatment are not uniform with regard to the position of the semiconductor wafer in the reaction tube, the speed of the plasma treatment cannot be easily increased and the diameter of the cross-section of the reaction tube tends to become too large if the number of the rows of semiconductor wafers is increased.

Another proposed plasma treatment method is known to manufacturers of semiconductor devices in which a batch of semiconductor wafers is treated on a plate arranged in a bell-jar type treatment vessel, instead of being arranged in tubular treatment vessels which have horizontal axes, as disclosed in the above-mentioned U.S. patents. A group of semiconductor wafers (i.e., the first batch) is placed flat on the plate in the treatment vessel during the plasma treatment, then these wafers are replaced by another group of semiconductor wafers (i.e., the next batch). However, the speed of mass-producing the treated semiconductor wafers cannot be easily increased because of the limited number of semiconductor wafers which can be included in a batch.

The present invention originated from attempts to solve the above-mentioned problems in the prior art.

SUMMARY OF THE INVENTION

It is an object of the present invention to provide a method and an apparatus for realizing a uniform distribution of plasma treatment effects both with regard to the surface of a substrate material and with regard to a group of substrate materials.

It is another object of the present invention to provide a method and an apparatus for speeding up the mass production of plasma treated substrate materials.

It is still another object of the present invention to provide a structure for supporting an electrode plate and also for forming an electrical power supplying circuit.

It is a further object of the present invention to provide a method and an apparatus for forming an excellent coating on a substrate material by plasma treatment, in the case where the plasma treatment is used for carrying out chemical vapor deposition.

It is a further object of the present invention to also provide a method and an apparatus for obtaining an excellent etching result, in the case where the plasma treatment is used for carrying out plasma etching.

BRIEF DESCRIPTION OF THE DRAWING

FIG. 2 is a cross-sectional view taken along the line II—II of FIG. 1, FIGS. 3, 4, and 5 illustrate in detail the parts of the apparatus shown in FIG. 1, wherein FIG. 4 is a cross-sectional view taken along the line IV—IV of FIG. 3, FIG. 6 shows the electrical circuitry for the apparatus shown in FIG. 1, FIGS. 7 and 8 show modified examples of the electrode plates for the apparatus shown in FIG. 1, which are used for carrying out plasma etching, wherein

DESCRIPTION OF THE PREFERRED EMBODIMENT

Figure 1:
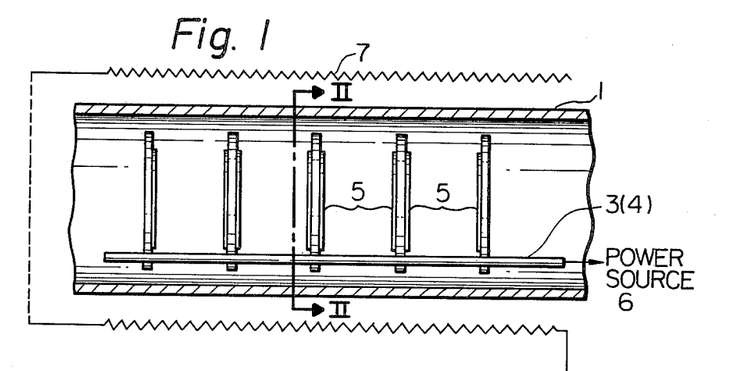
FIG. 1 shows a plasma treatment apparatus for explaining the fundamental structure of the present invention.
Figure 2:
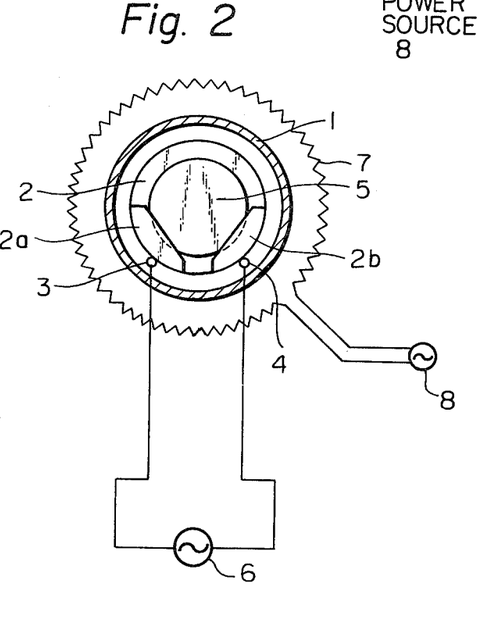

FIGS. 1 and 2 respectively show the fundamental structure of an apparatus used for plasma treatment of substrate materials, for example, semiconductor materials according to the present invention. In a reaction tube 1 made of quartz glass, pyrex glass or the like, a number of electrode plates 2 are arranged in series along the axis of the reaction tube 1. The planes of the electrode plates 2 are parallel to each other and perpendicular to the axis of the reaction tube 1. Each of the electrode plates 2 is fixed on a pair of electrode supports 3, 4 arranged in the reaction tube 1. The reaction tube 1 has a circular cross-section. Each electrode plate has portions 2a, 2b located in the lower part thereof where the thickness of the electrode plate is increased, thus forming a V-shaped slot 2c (FIG. 4) which serves as a holder of the edge of a semiconductor material such as a silicon substrate or wafer.

Each of the electrode plates 2 is connected to either of the two terminals of a power source 6 through one of the supports 3 and 4. Thus, the series of electrode plates 2 shown in FIG. 1 function as the electrically connected parallel capacitors shown in FIG. 6.

In operation, the reaction tube 1 is evacuated and a reaction gas is introduced therein. By applying DC (Direct Current), low-frequency or high-frequency electric power to the electrode plates 2, an electric field is created between adjacent electrode plates 2. Due to the effect of the established electric field, the reaction gas is thereby ionized and thus produces a plasma between the adjacent electrode plates 2.

Because the electric field is established uniformly between adjacent parallel electrode plates, the plasma is produced uniformly in the spaces between the electrode plates. Accordingly, the plasma treatment is effected uniformly on the semiconductor materials, such as on a silicon substrate or on wafers which are mounted on the electrode plates.

Prior to voltage application to the electrode plates, the reaction tube is evacuated and the reaction gas is introduced therein at a pressure of approximately 0.1 to 2 Torr. For the purpose of carrying out chemical vapor deposition, the reaction gas can comprise, for example, ammonia ($NH_3$), monosilane ($SiH_4$), nitrogen ($N_2$) or oxygen ($O_2$); while for the purpose of etching, the reaction gas can comprise, for example, carbon tetrafluoride ($CF_4$) or oxygen ($O_2$). If a high-frequency electric power is chosen as the type of electric power used for producing plasma, a relatively high frequency such as approximately 13 MHz may be selected. If heating of semiconductor materials is required during the plasma treatment, such heating is conducted by means of a heater 7 which surrounds the reaction tube 1 and is connected to the power source 8.

Figures 3, 4:
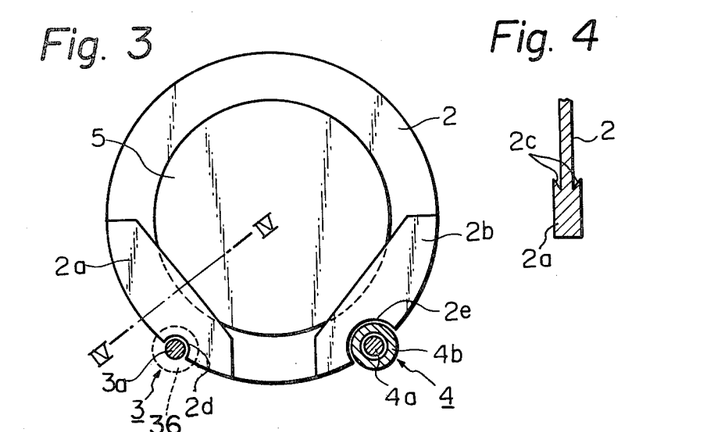
Figure 5:
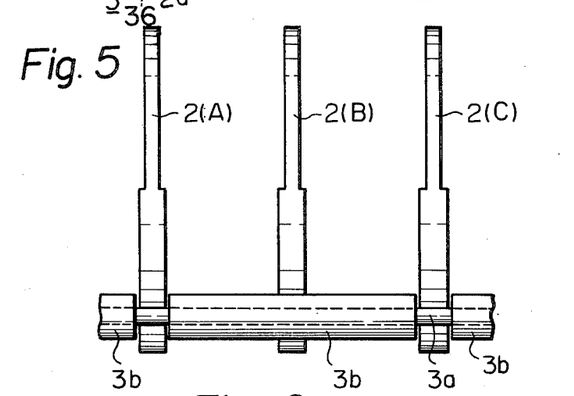

FIGS. 3, 4 and FIG. 5 illustrate the electrode plate and the electrode supports in detail. An electrode plate 2 has V-shaped slots 2c at the edges of the portions 2a, 2b which securely hold the edge of a semiconductor material to be mounted on the electrode plate. The semiconductor materials 5 can be mounted on both surfaces of the electrode plate 2, because the slots 2c are formed on both surfaces of the electrode plate 2. The location of the portions 2a, 2b and the depth of the slots are selected so that the center of the mounted semiconductor material 5 can coincide with the center of the electrode plate 2. The electrode supports 3, 4 comprise insulating sheaths 3b, 4b made of, for example, quartz, and electrically conductive rods 3a, 4a which penetrate the sheaths 3b, 4b. The electrode plate has a pair of semicircular recesses, a large diameter recess 2e and a small diameter recess 2d. The electrode plate 2 and rods 3a, 4a are made of, for example, aluminum. In the electrode plates 2(A) and 2(C) shown in FIG. 5, the rod 3a fits into the recess 2d at a location where the rod 3a is not covered by the insulation sheath 3b, and the rod 4a fits into the recess 2e at a location where the rod 4a is covered by the insulation sheath 4b. The electrode plate 2 may be welded to the rod 3a at the location of the recess 2d. Thus, the electrode plates 2(A) and 2(C) are electrically connected to the rod 3a and mechanically supported by the rod 3a and the insulated support 4 having the insulation sheath 4b. In the adjacent electrode plate 2(B) shown in FIG. 5, the large recess 2e and the small recess 2d are reversely located compared with the electrode plates 2(A) and 2(C). Thus, the adjacent electrode plate 2(B) is electrically connected to the rod 4a and mechanically supported by the rod 4a and the insulated support 3 having the insulation sheath 3b.

Figure 6:
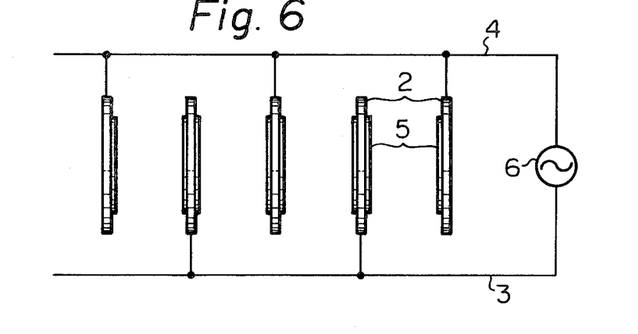

As illustrated in FIG. 6, each of the electrode plates 2 is electrically connected to a power source 6 through either of the rods 3a and 4a, in such a manner that each of the adjacent electrode plates 2 is connected to opposite terminals of the power source 6. The diameter and the level of the supports 3, 4 are selected so that the center of the electrode plates 2 supported by the supports 3, 4 can be positioned to coincide with the axis of the reaction tube 1.

Figure 7:
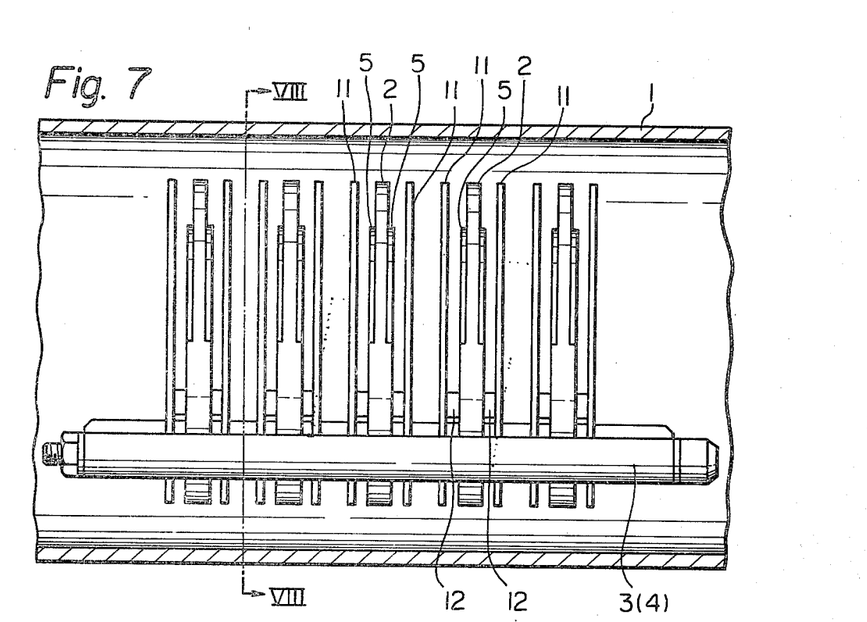
Figure 8:
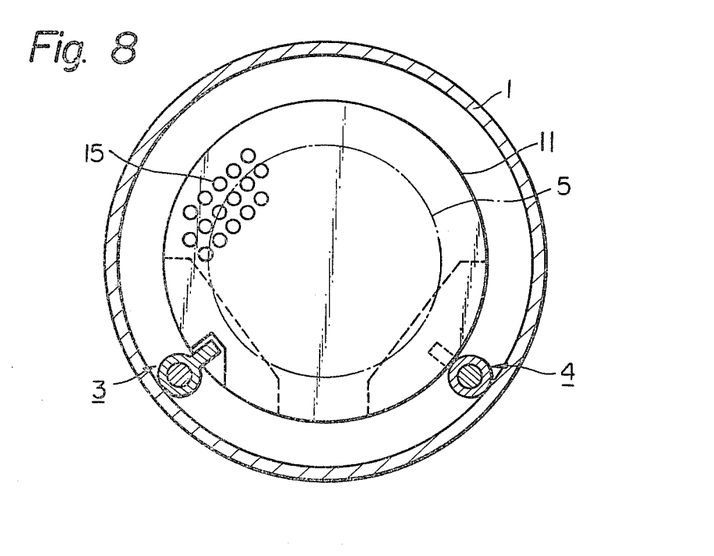
FIG. 8 is a cross-sectional view taken along the line VIII—VIII of FIG. 7, FIGS. 9 and 10 show a modified structure of the connection between the electrode plate and the conductor rod shown in FIG. 1.

FIGS. 7 and 8 show a modified structure of the electrode plates which are used for carrying out the plasma etching according to the present invention. A porous or meshy electrode 11 is arranged on both sides of each of the electrode plates 2 at a predetermined distance from the surface of the electrode plate 2. The polarity and the potential of the electrode 11 are kept the same as those of the corresponding electrode plate 2 situated between a pair of the porous or meshy electrodes 11. The porous or meshy electrode 11 is made of, for example, aluminum. A plasma producing discharge is formed between adjacent porous or meshy electrodes 11 having opposite polarities. Since the active substances in the produced plasma react with the surfaces of the semiconductor materials 5 mounted on the electrode plates 2 through the porosity or mesh 15 of the electrodes 11, undesirable sputtering of ions is suppressed and good results of plasma etching are obtained. In addition, the value of the applied plasma-producing voltage can be reduced because of the substantially reduced distance between the adjacent plasma-producing electrodes of opposite polarities due to the presence of the porous or meshy electrodes. The density of the reaction gas can be increased, and the uniformity of the plasma treatment can be enhanced.

Figure 9:
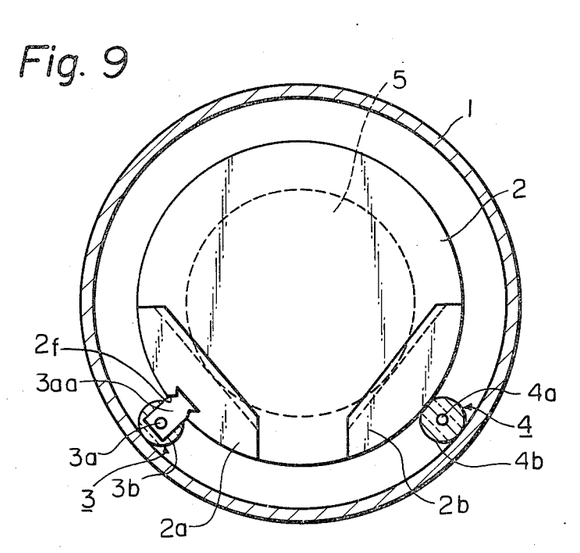
Figure 10:
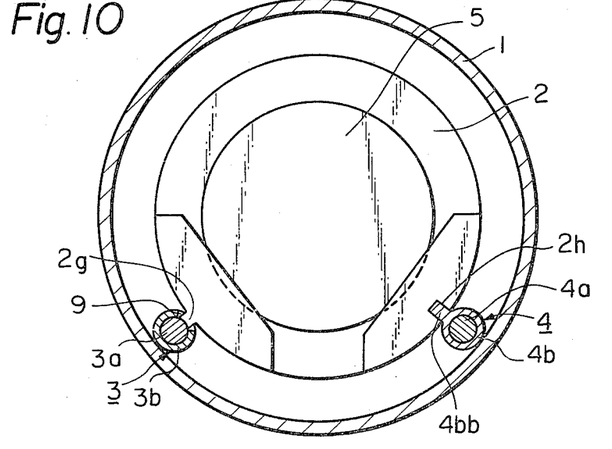

FIGS. 9 and 10 respectively show two examples of a modified structure for connecting electrode plates to electrode supports.

In FIG. 9, a projection of a member 3aa fixed to the rod 3a is fitted into a recess 2f formed on the edge of the electrode plate 2. Thus, the electrode plate 2 is electrically connected to the conductor rod 3a and mechanically supported by the conductor rod 3a and the insulated support 4 having the insulation sheath 4b.

In FIG. 10, a projection 2g is formed on a predetermined portion of the edge of the electrode plate 2. The projection 2g penetrates through a window 9 on the insulation sheath 3b and is electrically connected to the rod 3a. At another predetermined portion of the edge of the electrode plate 2, the electrode plate 2 is mechanically supported by a projection 4bb of the insulation sheath 4b.

In the structures for supporting electrode plates shown in FIGS. 3, 8, 9 and 10, the insulation sheaths 3b and 4b have extended portions in the direction perpendicular to the axes of the rods 3a, 4a at the ends of the sheaths 3b and 4b, and the extended portions are joined to each other to form a combined support structure (not shown in detail in these figures). By using the support structure, the following process of plasma treatment is performed. That is, before being placed in the reaction tube, electrode plates are fixed to the support structure, semiconductor materials to be plasma-treated are mounted on the electrode plates, and then the support structure carrying the electrode plates and semiconductor materials is inserted into a reaction tube to undergo plasma treatment.

Further, it is also possible to form additional extended portions of the insulation sheaths 3b, 4b in the downward direction to serve as legs of the electrode supports. According to this structure, the optimum horizontal position of the electrode plates relative to the reaction tube and hence the optimum horizontal position of the semiconductor materials to be treated relative to the reaction tube can be selected by varying the length of the legs.

Figure 11:
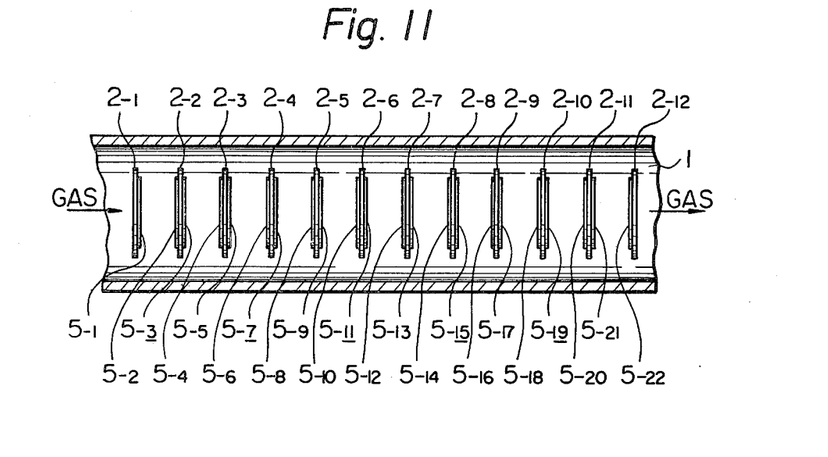
FIG. 11 shows the arrangement of electrode plates and semiconductor materials in the reaction tube for the embodiments of the present invention.

FIG. 11 shows the arrangement of silicon semiconductor substrates 5-1 through 5-22 mounted on the electrode plates 2-1 through 2-12 in the reaction tube 1 used for experimentation; the present invention, from which the following numbers and conditions arise by way of example. The reaction tube 1 is made of quartz glass and has an inner diameter of 115 mm. The electrode plate 2 is made of aluminum and has a diameter of 95 mm and a thickness of 3 mm, the thickness of the semiconductor material supporting portion being 5 mm. The silicon semiconductor material 5 has a diameter of 75 mm. The center of the silicon semiconductor material 5 is positioned to coincide with the axis of the reaction tube 1. The semiconductor material to be treated is mounted on the supporting portion of at least one side of the electrode plates. The electrode plates are supported by the electrode supports while the planes of the electrode plates are kept perpendicular to the axis of the electrode supports. The electrode supports carrying the electrode plates are inserted into and placed at a predetermined position in the reaction tube. In order to position the center of the electrode plate and the center of the semiconductor material so as to coincide with the axis of the reaction tube, the configuration of the supporting portion of the electrode plate and the level of the electrode support are predetermined. A high-frequency power source, for example, is connected to the conductive rods in the electrode supports.

In the apparatus shown in FIG. 11, twelve electrode plates are arranged in the reaction tube. The electrode plates 2-1 and 2-12 situated at both ends of a sequence of electrode plates carry the semiconductor materials to be treated only on the inside plane thereof, while the electrode plates 2-2 through 2-11 carry the materials on both planes thereof.

Five silicon semiconductor materials 5-3, 5-7, 5-11, 5-15 and 5-19 situated on the gas-exit side plane of the second, fourth, sixth, eighth and tenth electrode plates, respectively, are used as samples for measuring the effects of the plasma treatment.

An embodiment for obtaining a chemical vapor deposition will hereinafter be described with reference to FIGS. 12 through 15. In this embodiment, a silicon nitride ($Si_3N_4$) coating is formed on the surface of the silicon semiconductor material. In order to verify the uniformity of the formed coating, there was carried out a measurement of the thickness distribution of the formed coating in the cases of:

(a) varying the component ratio of the reaction gas;
(b) varying the pressure of the reaction gas;
(c) varying the high-frequency electrical power applied to the semiconductor material to be treated, and;
(d) varying the spacing of the adjacent semiconductor materials to be treated, respectively.

Figure 12:
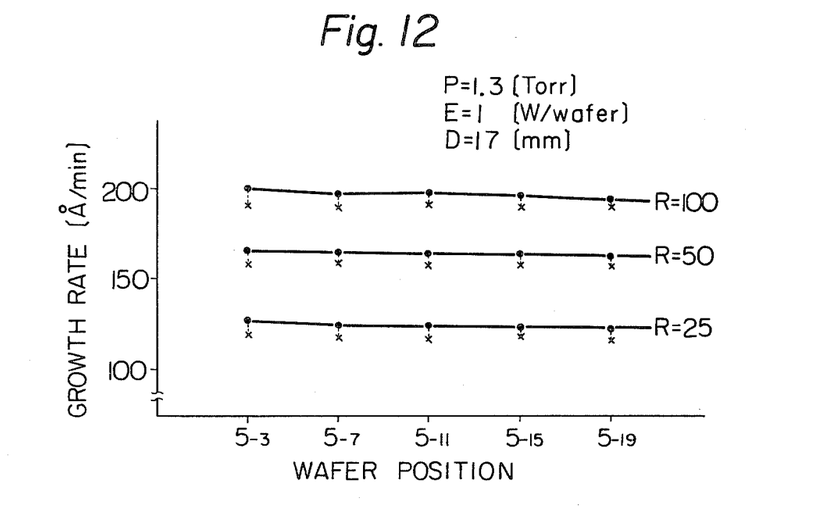
FIGS. 12 through 15 show results of an embodiment for the chemical vapor deposition.
Figure 13:
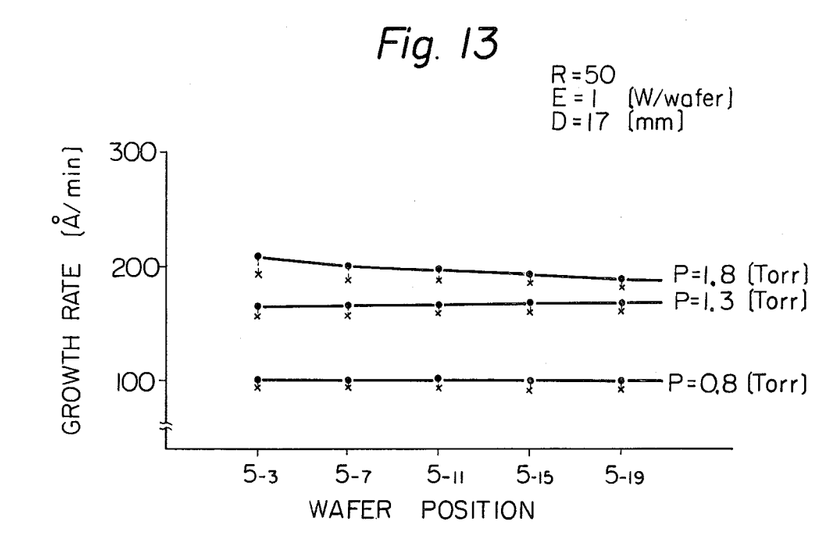
Figure 14:
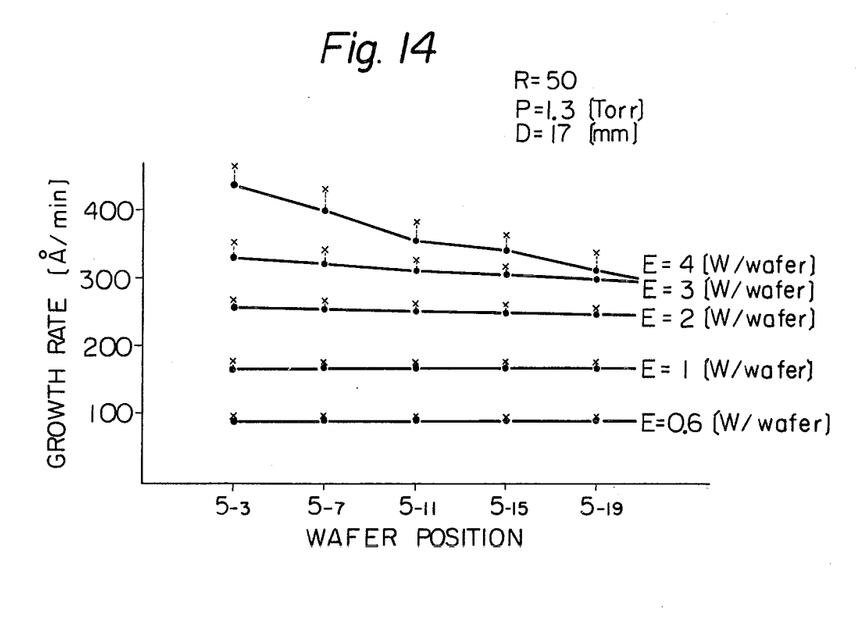
Figure 15A:
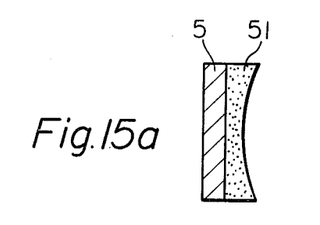
Figure 15B:
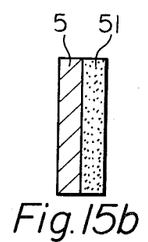
Figure 15C:
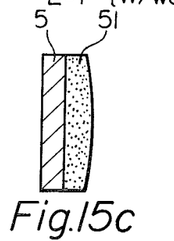
Figure 15D:
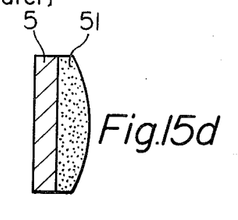

FIGS. 12, 13 and 14 are graphs obtained from the results of the experiments for an embodiment of the present invention in the case where the present invention is used for carrying out chemical vapor deposition on semiconductor materials. In these figures, the abscissa represents the position of the treated semiconductor material in the reaction tube and the ordinate represents the growth rate expressed in Å/min of the silicon nitride ($Si_3N_4$) coating on the surface of the treated semiconductor material. The rate of the coat formation at the center of the semiconductor material is plotted by a dot mark, while that for a position at the circumference of a circle which has a radius of 5 mm less than the radius of the semiconductor material is plotted by a cross mark. According to the arrangement in which the center of the electrode plate and the center of the semiconductor material are positioned to coincide with the axis of the reaction tube, the thickness of the formed coating is uniform along the circumference of the circle. In these experiments, the temperature of the semiconductor materials is kept around 350° C.

In FIG. 12, the parameter R represents the component (pressure) ratio between ammonia and monosilane ($R = NH_3/SiH_4$). The value of R is selected as 25, 50 or 100, respectively. The pressure of the reaction gas is maintained at 1.3 Torr, the spacing between the adjacent semiconductor materials is 17 mm, and the high-frequency electrical power fed to each semiconductor material is 1 W.

As for the chemical vapor deposition performed according to the present invention, as following from the deposition rates shown in FIG. 12, the variance of the thickness of the formed coatings on the samples of the semiconductor materials which belong to the same lot is too small to be detected and the difference between the thickness of the coating formed at the middle portion and the thickness of the coating formed at the peripheral portions is less than 5%, which is considered substantially negligible.

During the experiment for FIG. 12, it was found that the refractive index (n) of the formed silicon nitride coating is 2.0 when the component ratio (R) is selected from the range of 30 through 50. This value 2.0 is also the value of the refractive index of pure silicon nitride. Accordingly, the quality of the silicon nitride coating can be measured by using the refractive index.

In FIG. 13, the parameter P represents the pressure of the reaction gas. The value of P is selected as 0.8, 1.3 or 1.8 Torr, respectively. The value of R is selected as 50, the spacing between the adjacent semiconductor materials is 17 mm, and the high-frequency electrical power fed to each semiconductor material wafer is 1 W.

As shown in FIG. 13, the variance of the thicknesses of the formed coatings on the samples of the semiconductor materials which belong to the same lot for the is too small to be detected, and the difference between the thickness of the coating formed at the middle portion and the thickness of the coating formed at the peripheral portions is less than 5%.

In FIG. 14, the parameter E represents the high-frequency electrical power fed to each semiconductor material wafer. The value of E is selected as 0.6, 1, 2, 3 or 4 W/wafer, respectively. The value of R is selected as 50, the spacing between the adjacent semiconductor material wafers is 17 mm, and the pressure of the reaction gas is 1.3 Torr.

As following from the deposition rates shown in FIG. 14, the variance of the thicknesses of the formed coatings on the samples of the semiconductor materials which belong to the same lot is undetectable when the range of the high-frequency electrical power is between 0.6 W/wafer and 2 W/wafer, and the difference between the thickness of the coating formed at the middle portion and the thickness of the coating formed at the peripheral portions is less than 5%. However, both the variance and the difference of the thicknesses tend to increase in the case where the value of the high-frequency electrical power reaches approximately 3 or 4 W/wafer and the rate of deposition of the coating on the semiconductor material becomes too low for practical use.

FIG. 15 illustrates the products of the experiments for testing the effects of the present invention in the case where the present invention is used for carrying out the chemical vapor deposition on semiconductor materials. In this experiment the spacing of the semiconductor materials to be treated is varied. The spacing must be 10 mm, 15 mm, 20 mm and 30 mm in order to obtain the products (a), (b), (c) and (d), respectively. The value of R is selected as 50, the pressure of the reaction gas is 1.3 Torr, and the high-frequency electrical power fed to each of the semiconductor materials of silicon is 1 W. The deposited coating 51 is silicon nitride. The five samples described hereinbefore with reference to FIG. 11 are used for obtaining the data of each of the products (a) through (d). In FIG. 15, the following features can be observed. With regard to the product (a), the formed silicon nitride coating 51 is thin at the middle portion of the product as the result of a low deposition rate, and thick at the peripheral portions of the product as the result of a high deposition rate. With regard to the product (b), the thickness of the formed silicon nitride coating is uniform on the entire surface of the semiconductor material. With regard to the product (c), the formed silicon nitride coating is thick at the middle portion of the product and thin at the peripheral portions of the product. With regard to the product (d), the formed silicon nitride coating is thicker at the middle portion of the product and thinner at the peripheral portions of the product than in the case of the product (C).

In the foregoing experiments, the temperature of the semiconductor materials is kept around 350° C. by means of heating. Such heating improves the quality of the formed coating, which quality can be measured in terms of the strength, uniformity and other characteristics of the formed coating. A temperature below 500° C. does not produce any harmful effect on the uniformity of the thickness of the coating formed on the semiconductor material.

Relating to the foregoing description of the experiments, the inventor of the present invention has confirmed that the chemical vapor depositions of silicon dioxide, polycrystalline silicon, phosphosilicate glass, borosilicate glass, and the like can be carried out by selecting the reaction gas. According to an experiment with the present invention, a silicon dioxide coating of a uniform thickness can be obtained at a deposition rate which is similar to that of silicon nitride, by using the reaction gas of oxygen ($O_2$) and monosilane ($SiH_4$) and by selecting the component ratio of the reaction gas, the pressure of the reaction gas, the high-frequency electrical power and the spacing between the adjacent semiconductor materials in a way similar to that of the case of silicon nitride. According to another experiment conducted by the inventor of the present invention, good results were obtained in forming a polycrystalline silicon coating by the vapor decomposition of monosilane ($SiH_4$), and in forming a phosphosilicate glass coating by vapor reaction of phosphine ($PH_3$), oxygen ($O_2$), and monosilane ($SiH_4$). Hence, it is expected that a good result can be obtained in forming borosilicate glass by the vapor reaction of diborane ($B_2H_6$), oxygen ($O_2$), and monosilane ($SiH_4$).

It is also expected that, instead of the insulation material coating, a metal coating can be obtained by using a reaction gas of hydrides or halides, for example, $(C_2H_5)_3Al$ for obtaining an aluminum coating, $MoF_6$ for obtaining a molybdenum coating, and $WF_6$ for obtaining a tungsten coating. During formation of the metal coatings, the structure of FIG. 10 can be modified in order to prevent the influence of plasma on the supports 3 and 4 by, for example, increasing the length of the projection 2g of the electrode plate 2 and the length of the projection 4bb of the insulation sheath 4b.

Figure 16:
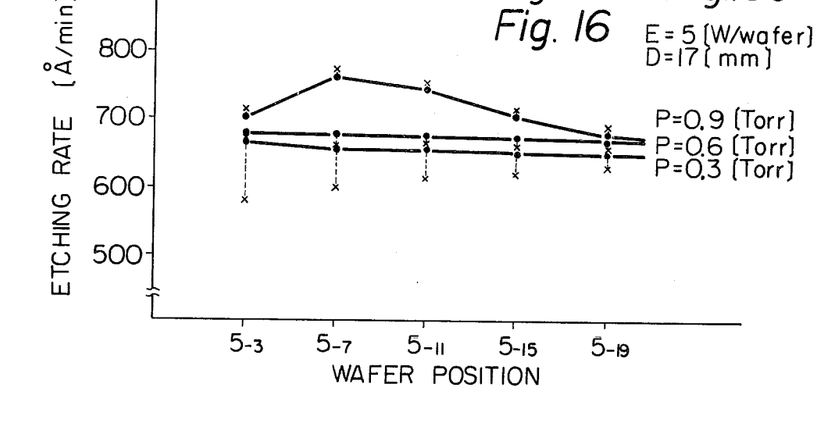
FIGS. 16 through 19 show results of another embodiment for the plasma etching, according to the present invention.
Figure 17:
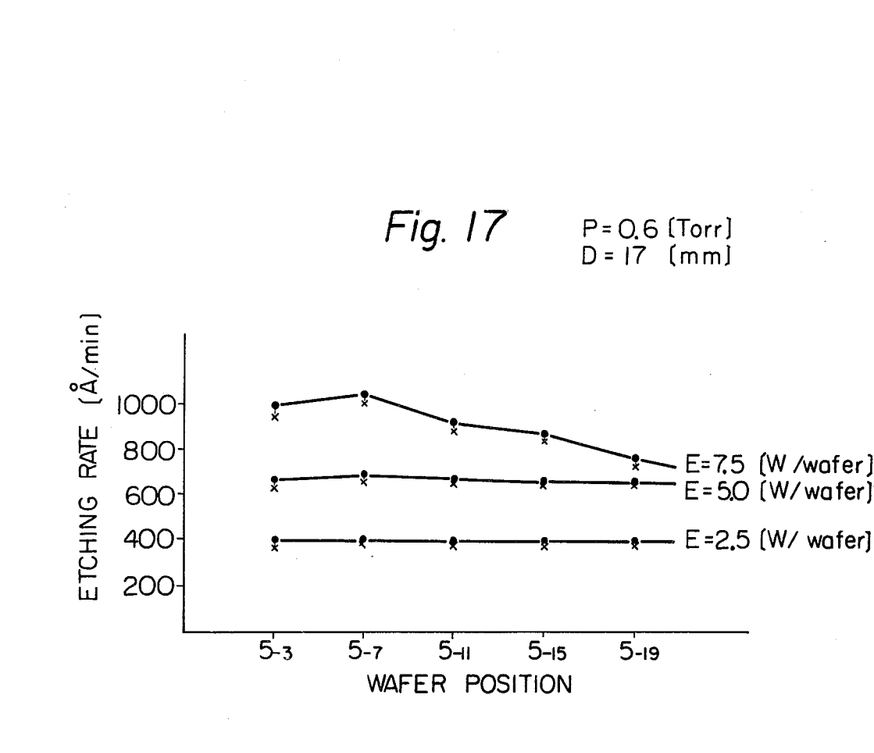
Figure 18A:
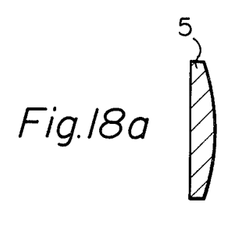
Figure 18B:
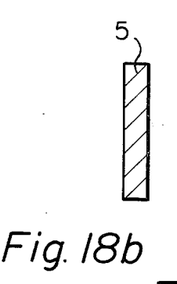
Figure 18C:
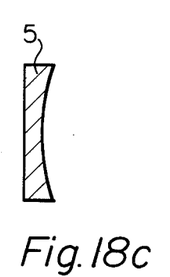
Figure 18D:
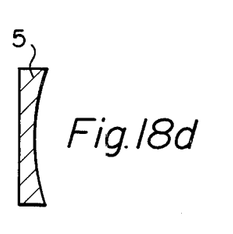

FIGS. 16 and 17 are graphs obtained from the results of the experiments for another embodiment of the present invention in the case where the present invention is used for carrying out the etching of silicon semiconductor substrates. In these figures, the abscissa represents the position of treated semiconductor material in the reaction tube and the ordinate represents the etching rate (Å/min) of silicon semiconductor material. The etch rate at the center of the semiconductor materials is plotted by dot marks, while the etch rate at 5 mm inside from the periphery of the semiconductor materials is plotted by cross marks. In this experiment, the etching gas consists of carbon tetrafluoride containing 5% (volume) oxygen, and the semiconductor materials are maintained at a temperature of 20° C. during the treatment.

In FIG. 16, the parameter P represents the pressure of the reaction gas. The value of P is selected as 0.3, 0.6 or 0.9 Torr, respectively.

As following from the etch rates shown in FIG. 16, the variance of the etched depths on the samples of the semiconductor materials which belong to the same lot is too small to be detected in the case where the pressure of the reaction gas is selected to be, for example, 0.6 Torr. Also, the difference between the etched depths on the samples of the semiconductor material at the middle portion and the etched depths at the peripheral portions is less than 3%, which difference is considered substantially negligible. In the case wherein the pressure of the reaction gas is selected to be 0.9 Torr, the variance is 10% and the difference is less than 3%. Thus, the percentage of the variance is larger than in the case wherein the pressure of the gas is selected to be 0.6 Torr. However, the plasma etching can be carried out for a practical use at a high etching rate in the case wherein the pressure of the reaction gas is selected to be 0.9 Torr.

In FIG. 17, the parameter E represents the high-frequency electrical power applied to semiconductor materials. The value of E is selected as 2.5, 5.0 and 7.5 W/wafer, respectively.

As following from the etch rates shown in FIG. 17, the variance of the etched depths on the samples of the semiconductor materials which belong to the same lot is too small to be detected in the case where the high-frequency electrical power is selected within the range of from 2.5 W/wafer through 5 W/wafer. Also, the difference between the etched depths on the samples of the semiconductor material at the middle portion and at the peripheral portions is less than 3%. However, in the case in which the high-frequency electrical power is raised to 7.5 W/wafer, the variance of the etched depths among the samples tends to increase. In the case wherein the high-frequency electrical power is reduced below 2.5 W/wafer, the etching rate becomes too low for practical use.

FIG. 18 illustrates the products of the experiments used for testing the effects of the present invention in the case where the present invention is used for carrying out the etching of the semiconductor materials. In this experiment, the spacing of the treated semiconductor materials is varied. To obtain the products (a), (b), (c), and (d), the spacings are 10 mm, 15 mm, 20 mm and 30 mm, respectively. The five samples described hereinbefore with reference to FIG. 11 are used for obtaining data of each of the products (a) through (d). In these experiments, the pressure of the reaction gas is 0.6 Torr, and the high-frequency electrical power fed to each of the semiconductor materials is 5 W.

In FIG. 18, the following features can be observed. With regard to the product (a), the etched semiconductor material is thick at the middle portion, thus showing a small amount of etching and thin at the peripheral portions showing a large amount of etching. With regard to the product (b), the etched semiconductor material has a uniform thickness throughout the entire surface thereof. With regard to the product (c), the etched semiconductor material is thin at the middle portion and thick at the peripheral portions. With regard to the product (d), the etched semiconductor material is thinner at the middle portion and thicker at the peripheral portions, than in the case of the product (c).

The inventor of the present invention has confirmed by experiments that the etching of insulation coatings, for example, silicon dioxide coating, silicon nitride coating, polycrystalline coating, phosphosilicate glass, borosilicate glass, or photoresist material, and the etching of metal coatings, for example an aluminum coating, can be obtained according to the present invention. For the etching of aluminum coatings, a reaction gas such as carbon tetrachloride can be used.

Figure 19:
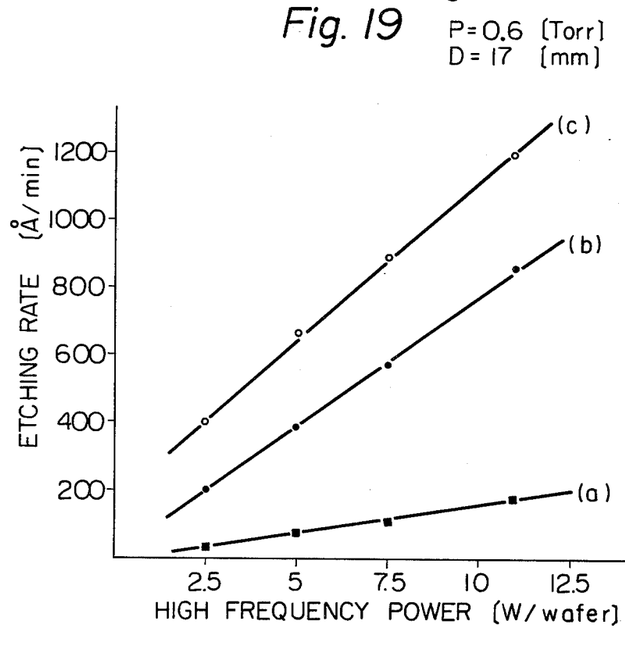

FIG. 19 is a graph obtained from the results of the experiment for testing the effects of the present invention in the case where the present invention is used for carrying out the etching of the semiconductor materials having no coatings or having a coating of silicon nitride or silicon dioxide. In FIG. 19, the abscissa represents the high-frequency electrical power fed to the electrode plates W/wafer and the ordinate represents the etching rate in Å/min of the semiconductor materials. In this experiment, the etching gas consists of carbon tetrafluoride containing 5% by (volume) oxygen, the pressure of the gas is 0.6 Torr, and the spacing between adjacent semiconductor materials to be treated is 17 mm. In FIG. 19, the curves (a), (b) and (c) represent the etching rates of silicon dioxide coating, silicon nitride coating, and silicon semiconductor substrate, respectively. It was found during this experiment that the variance of the etched depths on the silicon nitride or silicon dioxide coating of the semiconductor materials which belong to the same lot was too small to be detected, and that the difference between the etched depths of the silicon nitride or silicon dioxide coating at the middle portion of the semiconductor material and the etched depths at the peripheral portions thereof was also too small to be detected.

What is claimed is:

1. An apparatus for plasma treatment of a plurality of pieces of substrate material, said treatment comprising a selected one of coating and etching, said apparatus comprising a reaction tube, means for introducing a reaction gas into said reaction tube to be ionized, a series of electrode plates corresponding to said plurality of pieces for supporting said pieces in said reaction tube, said plates being arranged in said reaction tube with the planes of said electrode plates being parallel to each other and transverse to the axis of said reaction tube, and a pair of electrode supports which support said electrode plates, said electrode supports comprising electrical connection means for applying a voltage across adjacent pairs of said electrode plates.

2. An apparatus as in claim 1 wherein said planes of said electrode plates are perpendicular to the axis of said reaction tube.

3. An apparatus as in claim 1, further comprising a porous electrode located in front of each said piece being supported by the corresponding one of said electrode plates, and connection means for providing an electrical potential to each said porous electrode equal to the potential at the respective one of said corresponding electrode plates resulting from said voltage application.

4. An apparatus as in claim 1 wherein each of said electrode plates has at least one recess on its periphery, and each said electrode support comprises an insulation tube and a conductor rod penetrating through said insulation tube, wherein a selected one of said insulation tube and said conductor rod can fit into said at least one recess on said periphery of each of said electrode plates.

5. An apparatus as in claim 4 comprising two of said recesses in each said electrode plate, and wherein each one of said conductor rods is fitted into one of said recesses in aternate ones of said plates to form an electrical connection, and the one of said insulation tubes which is penetrated by the other of said rods is fitted into the other one of said recesses in said alternate plates without forming an electrical connection for effecting said voltage application across adjacent pairs.

6. An apparatus as in claim 1, each of said electrode supports comprising a conducting rod and an insulating sheath, said apparatus comprising a conducting part fixed to said conductor rod and fitted into a respective one of said at least one recesses in selected ones of said electrode plates, for effecting said voltage application.

7. An apparatus as in claim 1, each of said electrode supports comprising a conducting rod and an insulating sheath, said electrical connection means comprising electrical connection through a plurality of holes formed in each said insulating tube.

8. An apparatus for plasma treatment of a plurality of pieces of material, said treatment comprising at least one treatment selected from coating and etching, said apparatus comprising:

a reaction tube;

means for introducing a gas comprising a reaction gas into said reaction tube, a plurality of conducting electrode plates located in said reaction tube, the number of each said electrode plates corresponding to the number of said pieces, each of said plates comprising means for supporting the corresponding one(s) of said pieces, said plates being oriented parallel to each other and transversely to said reaction tube, means for applying voltage across adjacent ones of said plates to create a plasma with said reaction gas for effecting said treatment.

9. The apparatus of claim 8 comprising at least two supports for supporting said plates in said reaction tube, two of said supports comprising means for applying said voltage.

10. The apparatus of claim 9, each of said two supports comprising said means for applying said voltage comprising a conducting rod, an insulating sheath selectively covering said conducting rod, and connecting means for electrically connecting said conducting rod to selected ones of said electrode plates.

11. The apparatus of claim 10, each of said electrode plates having at least one recess on its periphery, at least one of said recesses being sized for inserting a selected one of said conducting rods for effecting said electrical connection, alternate ones of said plates being thusly electrically connected to a respective one of said conducting rods, so that said application of said voltage across said adjacent ones of said plates may be effected by applying a voltage across said two conducting rods.

12. The apparatus of claim 10, said connecting means comprising a projection of each of said selected electrode plates to electrically contact said conducting rod through a respective one of a plurality of holes in said insulating sheath.

13. The apparatus of claim 10, said supports for said plates comprising a projection from selected portions of each of said insulating sheaths into a corresponding preformed recess on selected ones of said plates.

14. The apparatus of claim 10, said connecting means comprising a plurality of conducting parts connected to each said conducting rod, each said electrode plate having at least one recess, and each said conducting part fitting into a respective one of said recesses in selected ones of said electrode plates.

15. The apparatus of claim 8, said electrode plates being evenly spaced along said reaction tube for effecting said treatment uniformly on selected surfaces of each of said pieces.

16. The apparatus of claim 8, comprising a porous electrode in front of each said piece and means for electrically connecting each said porous electrode to the respective one of said electrode plates corresponding to the one of said pieces in front of which the respective one of said porous electrodes is mounted.

17. The apparatus of claim 8, said treatment comprising coating, said apparatus comprising means for heating said pieces.

18. An apparatus for plasma treatment of a plurality of relatively flat pieces of material, said treatment comprising a selected one of coating and etching, said apparatus comprising:

a reaction tube;

a plurality of electrodes symmetrically placed in said reaction tube, the number of said electrodes responding to the number of said pieces;

support means for supporting said pieces in said reaction tube with said relative flat pieces aligned parallel to each other and traversely to the axis of said reaction tube;

means for introducing a gas comprising a component necessary for said selected treatment of said pieces of material;

voltage means for applying voltages across adjacent ones of said electrodes for uniformly generating said plasma over symmetrically distributed regions of said reaction tube, said symmetrically distributed regions corresponding to said symmetrically placed electrodes.

19. The apparatus of claim 18, said treatment comprising uniform treatment of selected portions of each of said pieces of material, said electrodes being relatively symmetric at least about the axis of said reaction tube, said electrodes being evenly distributed along the axis of said reaction tube and transverse to said axis, each of said pieces being supported in the immediate vicinity of the corresponding one of said electrodes, and said voltage means comprising means for alternately connecting in common each of said electrodes.

* * * * *

UNITED STATES PATENT AND TRADEMARK OFFICE
CERTIFICATE OF CORRECTION

PATENT NO. : 4,178,877
DATED : December 18, 1979
INVENTOR(S) : DAIZIRO KUDO

It is certified that error appears in the above—identified patent and that said Letters Patent is hereby corrected as shown below:

In Figure 3 on sheet 2 of the drawings, please change the reference character "36" to --3b--.

Col. 1, line 24, "an" should be --the--;

Col. 2, line 35, "DRAWING" should be --DRAWINGS--;

Col. 6, line 64, delete "for the".

Signed and Sealed this

Seventeenth Day of June 1980

[SEAL]

Attest:

SIDNEY A. DIAMOND

Attesting Officer      Commissioner of Patents and Trademarks